(12) United States Patent
Hakey et al.

(10) Patent No.: US 7,027,125 B2
(45) Date of Patent: *Apr. 11, 2006

(54) SYSTEM AND APPARATUS FOR PHOTOLITHOGRAPHY

(75) Inventors: Mark Charles Hakey, Fairfax, VT (US); David Vaclay Horak, Essex Junction, VT (US); Charles William Koburger, III, Delmar, NY (US); Peter H. Mitchell, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 126 days.

This patent is subject to a terminal disclaimer.

(21) Appl. No.: 10/808,740

(22) Filed: Mar. 25, 2004

(65) Prior Publication Data

US 2005/0213061 A1    Sep. 29, 2005

(51) Int. Cl.
*G03B 27/52* (2006.01)
*G03B 27/42* (2006.01)

(52) U.S. Cl. .......................... 355/30; 355/53
(58) Field of Classification Search .............. None
See application file for complete search history.

(56) References Cited

FOREIGN PATENT DOCUMENTS

WO    WO 2004/093159 A2 * 10/2004

OTHER PUBLICATIONS

U.S. Appl. No. 10/707,894, filed on Jan. 21, 2004, entitled "Liquid-Filled Balloons for Immersion Lithography," by Mark C. Hakey et al.

* cited by examiner

*Primary Examiner*—Peter B. Kim
(74) *Attorney, Agent, or Firm*—Rabin & Berdo, P.C.

(57) ABSTRACT

A photolithographic apparatus, system and method employing an improved refractive medium. The photolithographic apparatus may be used in an immersion lithography system for projecting light onto a workpiece such as a semiconductor wafer. In one embodiment, the photolithographic apparatus includes a container containing a transparent fluid. The fluid container is positioned between a lens element and the wafer. The container is further characterized as having a substantially flexible and transparent bottom membrane contacting an upper surface of the wafer and overlapping at least one side edge of the wafer such that a fluid filled skirt is formed extending beyond the edges of the wafer.

20 Claims, 2 Drawing Sheets

SYSTEM AND APPARATUS FOR PHOTOLITHOGRAPHY

CROSS REFERENCE TO RELATED APPLICATIONS

The present application is related to the following co-pending U.S. patent application Ser. No. 10/707,894 filed on Jan. 21, 2004, titled "Liquid-Filled Balloons For Immersion Lithography." The above-referenced patent application is assigned to the assignee of the present invention. The content of the cross-referenced co-pending application is incorporated herein by reference in its entirety.

BACKGROUND OF THE INVENTION

1. Field of the Invention

The present invention generally relates to lithography for semiconductor fabrication, and in particular, to utilizing a liquid medium through which a semiconductor substrate is illuminated during photolithography. More particularly, the present invention relates to an immersion lithography system and apparatus that employs membrane barriers for controlling exposure of system components to immersion liquid.

2. Background Information

Lithography, in the context of building integrated circuits (ICs) such as microprocessors and memory chips, is a highly specialized printing process used to put detailed patterns onto silicon wafers. An image containing the desired pattern is projected onto the wafer through a mask defining the pattern. Prior to light projection through the mask, the wafer is coated with a thin layer of photosensitive material called "resist." The bright parts of the image pattern cause chemical reactions which cause the resist material to become more soluble, and thus dissolve away in a developer liquid; the dark portions of the image remaining insoluble. After development, the resist forms a stenciled pattern across the wafer surface which accurately matches the desired mask pattern. Finally, the pattern is permanently transferred onto the wafer surface in an etching process wherein, for example, a chemical etchant is used to etch the portions of the wafer surface not protected by resist.

With the image resolution of lithography as the limiting factor in the scaling of the IC devices, improvements in lithographic components and techniques is critical to the continued development of more advanced and compact ICs. The scaling limitation for optical lithography is expressed by the Rayleigh equation:

$$W = \frac{k\lambda}{NA}$$

where k is the resolution factor, $\lambda$ is the wavelength of the exposing radiation, and NA is the numerical aperture. NA may be determined by the acceptance angle of the lens and the index of refraction of the medium surrounding the lens, as follows:

$$NA = n \sin \alpha$$

where n is the index of refraction of the medium surrounding the lens and $\alpha$ is the acceptance angle of the lens.

Faced with problems and limitations relating to using shorter wavelength light sources, optical lithography developers have increasingly looked for ways of increasing the NA of lithography systems. Having low radiation absorption characteristics, air has traditionally been used as the transmitting medium. However, having an index of refraction n=1, air as the radiation medium presents a clear limit to the NA and consequently to the minimum scaling size. Immersion lithography, in which a liquid having a higher index of refraction is used as the medium, is therefore rapidly emerging as an important candidate for upcoming semiconductor lithography applications.

A number of practical issues to implementing immersion lithography remain, including maintaining a pure, non-obstructing transmission medium and compatibility of the tools and wafer with the liquid medium. Purified and degassed water, having a light absorption of 5% at working distances up to 6 mm and an index of refraction n=1.47, may be a suitable medium for immersion lithography. However, problems remain relating to the tendency to form bubbles during the scanning processing. The stage on a lithography exposure tool steps from location to location across a wafer scanning the reticule image for each field. To achieve high throughput, the stage must accelerate rapidly, move accurately to the next field location, settle, scan the image and then step to the next location all in a short period of time. A water medium is susceptible to forming micro-bubbles and nano-bubbles in the cavitation prone water layer near the moving surfaces. In addition to problems associated with maintaining purity of the liquid, immersion lithography requires substantial redesign of the stage for compatibility in a submerged liquid environment requiring significant re-engineering and adding to development costs.

An improved immersion lithography apparatus that addresses the foregoing problems is disclosed by the above-incorporated patent application "LIQUID-FILLED BALLOONS FOR IMMERSION LITHOGRAPHY". The improved apparatus utilizes a liquid-filled balloon that is positioned between a semiconductor workpiece and a lithography light source. With both the balloon membrane and the enclosed liquid exhibiting good optical properties, the system NA is increased for enhanced resolution without the additional complexity and expense of maintaining a liquid in contact with the lithography equipment and workpiece.

However, it would be desirable to further improve conventional immersion lithography techniques while providing more efficient membrane contained immersion liquid lithographic techniques.

SUMMARY OF THE INVENTION

A photolithographic apparatus, system and method employing an improved refractive medium are disclosed herein. The photolithographic apparatus may be used in an immersion lithography system for projecting light onto a workpiece such as a semiconductor wafer. In one embodiment, the photolithographic apparatus includes a container containing a transparent fluid. The fluid container is positioned between a lens element and the wafer. The container is further characterized as having a substantially flexible and transparent bottom membrane contacting an upper surface of the wafer and overlapping at least one side edge of the wafer such that a fluid filled skirt is formed extending beyond the edges of the wafer.

All objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENTS

The present invention is described in more detail by way of example with reference to the accompanying figures. It should be kept in mind that the following descriptive embodiments are only presented by way of example and should not be construed as limiting the inventive concept to any particular physical configuration. While this invention is described in terms of the best mode for achieving this invention's objectives, it will be appreciated by those skilled in the art that variations may be accomplished in view of these teachings without deviating from the spirit or scope of the present invention. Furthermore, when used and unless otherwise stated, the terms "upper," "lower," "front," "back," "over," and "under," and similar position related terms are not to be construed as limiting the invention to a particular orientation. Instead, such terms are to be construed only on a relative basis.

The present invention is generally directed toward a photolithography apparatus, system and method in which a liquid medium having an index of refraction greater than that of air is deployed as the optical transmission medium in the optical path between a final lens element and the working surface of a semiconductor wafer. An exemplary embodiment of the invention includes a liquid filled membrane that may be positioned between a workpiece, such as a semiconductor wafer covered with a photoresist material, and a lithography light source. As utilized herein, the membrane may be any of a variety of substantially flexible and possibly elastic fluid containers. The membrane container includes a thin, pliable membrane skin that is substantially transparent, liquid impermeable, having an index of refraction greater that that of air and preferably close or the same as the immersion liquid. The liquid or fluid contained in the membrane container exhibits similar transparent properties and furthermore preferably has an index of refraction greater than that of air. In one embodiment, light from the lithography light source passes through a mask and lens assembly, through a top layer of the enclosed membrane, through the contained fluid, through a bottom layer of the enclosed membrane, and onto the workpiece where it alters portions of the photoresist surface. In an alternate embodiment in which an open membrane container is employed, the light passed from the lens assembly directly into and through the contained fluid, through the bottom membrane layer and onto the photoresist surface. In this manner, the present invention provides an enhanced refractive light transmission medium while shielding the wafer photoresist surface from direct contact with the fluid.

Figure 1:
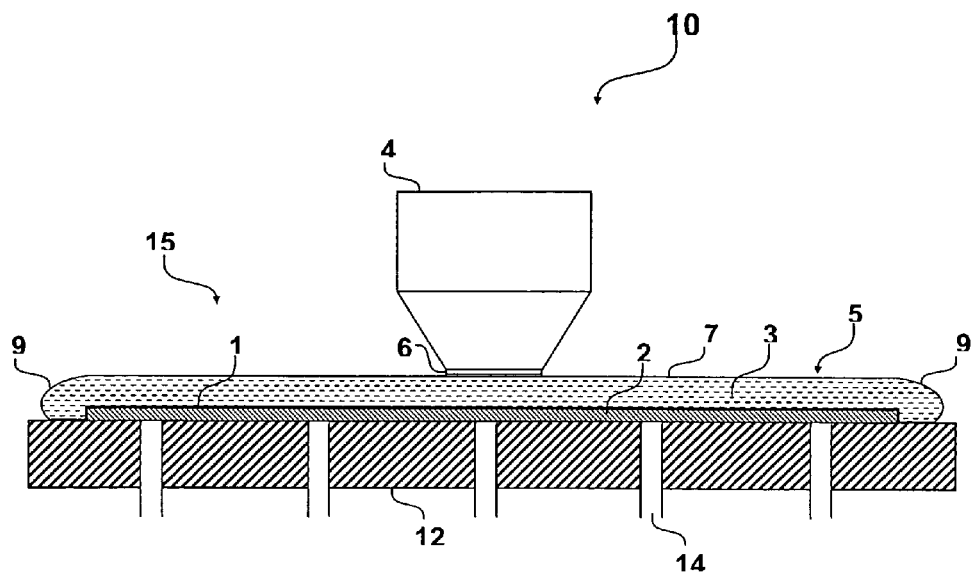
FIG. 1 depicts a cross-sectional view of a photolithographic system in accordance with one embodiment of the present invention.

With reference now to the figures, wherein like reference numerals refer to like and corresponding parts throughout, and in particular with reference to FIG. 1, there is depicted a cross section view of a photolithographic system 10 in accordance with one embodiment of the present invention. Photolithographic system 10 generally comprises a photolithographic stage apparatus 15 positioned below a lens assembly 4. Although not explicitly depicted in FIG. 1, lens assembly 4 preferably includes devices and components for directing and focusing a light source, such as a deep ultraviolet light beam onto the working surface 11 of a wafer 2, which is typically coated with a photoresist material (not depicted). A mask (not depicted) between the light source and lens assembly 4 defines a pattern to be cured on the photoresist material.

Positioned below and in substantial abutment with a final lens cover 6 of lens assembly 4, photolithographic apparatus 15 includes semiconductor wafer 2 supported by a workpiece support member in the form of a wafer chuck 12. Wafer chuck 12 preferably includes multiple vacuum ports 14 for securely maintaining wafer 2 in a specified position against its upper surface. In accordance with well known photolithographic processes, apparatus 15 and/or lens assembly 4 may be movable in respective parallel planes such as during a scanning or step and scan procedure.

Photolithographic apparatus 15 further includes a fluid container 5 positioned between lens cover 6 and the upper surface 11 of wafer 2. In accordance with the depicted embodiment, fluid container 5 comprises an enclosed, liquid impermeable membrane 7 containing a substantially transparent fluid 3. Forming a complete enclosure around the fluid 3, membrane 7 includes a bottom layer resting against the upper surface of wafer 2 and a top layer against which lens cover 6 abuts. Both membrane 7 and the fluid 3 contained therein preferably exhibit optimum light transmission characteristics (i.e. low absorption) at the wavelength used for the lithographic process. In one embodiment, fluid 3 comprises purified and degassed water having low light absorption characteristics and serving as an improved refractive medium compared with air, which is used in non-immersion systems. To minimize the possibility of bubble formation, the entire enclosed space of fluid container 5 is preferably occupied by fluid 3.

Any air gap, such as a gap between lens cover 6 and the top layer of fluid container 5 would reduce the effectiveness of the container 5 in enhancing imaging resolution. Therefore, and referring still to FIG. 1, fluid container 5 is preferably sized to cover the entire working surface of wafer 2, and to substantially occupy the entire volume between lens cover 6 and wafer 2. Materials employed for the top and bottom layers of membrane 7 must be sufficiently pliant such that with fluid container 5 placed on the surface of wafer 2, membrane 7 assumes a repose position substantially conforming to the contour and irregularities present in the surface of wafer 2. Furthermore, fluid container 5 may comprise a balloon-like member having one of many possible contour shapes depending on the flexibility or elasticity or lack thereof of membrane 7 and logistical requirements.

In an important feature of the embodiment depicted in FIG. 1, the top and bottom membrane layers of fluid container 5 substantially extend beyond the vertical side edges of wafer 2 to form fluid filled skirt portions 9. As shown in FIG. 1, the fluid filled skirts 9 overlap the side edges of wafer 2 such that the bottom membrane layer substantially contacts and conforms to the surface contour of the corner and vertical side edges of the wafer 2. In a preferred embodiment, fluid filled skirt 9 extends substantially beyond the wafer side edges by a distance of between 15 and 30 mm such that the bottom membrane layer is further vertically supported by the upper surface of wafer chuck 12.

Having flexibly extending skirt regions such as depicted in FIG. 1 enables a consistent scanning medium as lens cover 6 approaches and reaches the periphery of wafer 2, resulting in a more efficient photolithographic process. In addition, the skirt 9 provides an additional fluid sump extending beyond the working surface which serves to absorb and dampen fluid turbulence that would otherwise occur near or within the light transmission path, resulting in improved imaging resolution.

Except for the fluid container 5, the aforementioned arrangement of features of photolithographic system 10 is intended to represent a broad category of lithography systems that may benefit from having a liquid with a high refraction index and low absorption being positioned between the light source and workpiece. Alternate lithographic systems, now known or hereafter developed, that may accommodate a liquid filled membrane between the workpiece and light source may be utilized without departing from the spirit and scope of the present invention.

Figure 3:
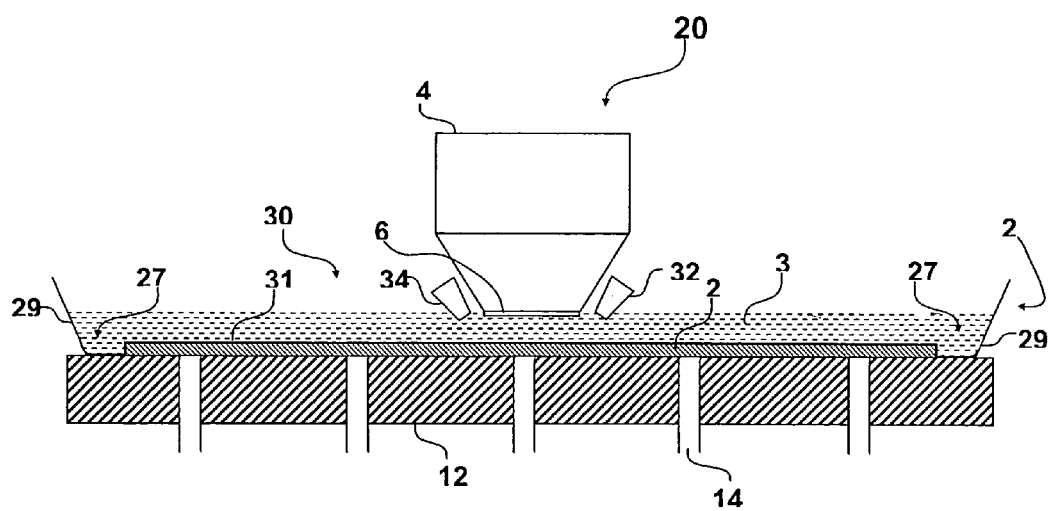
FIG. 3 depicts a photolithographic system incorporating the apparatus shown in FIG. 2 in accordance with an embodiment of the present invention.
Figure 2:
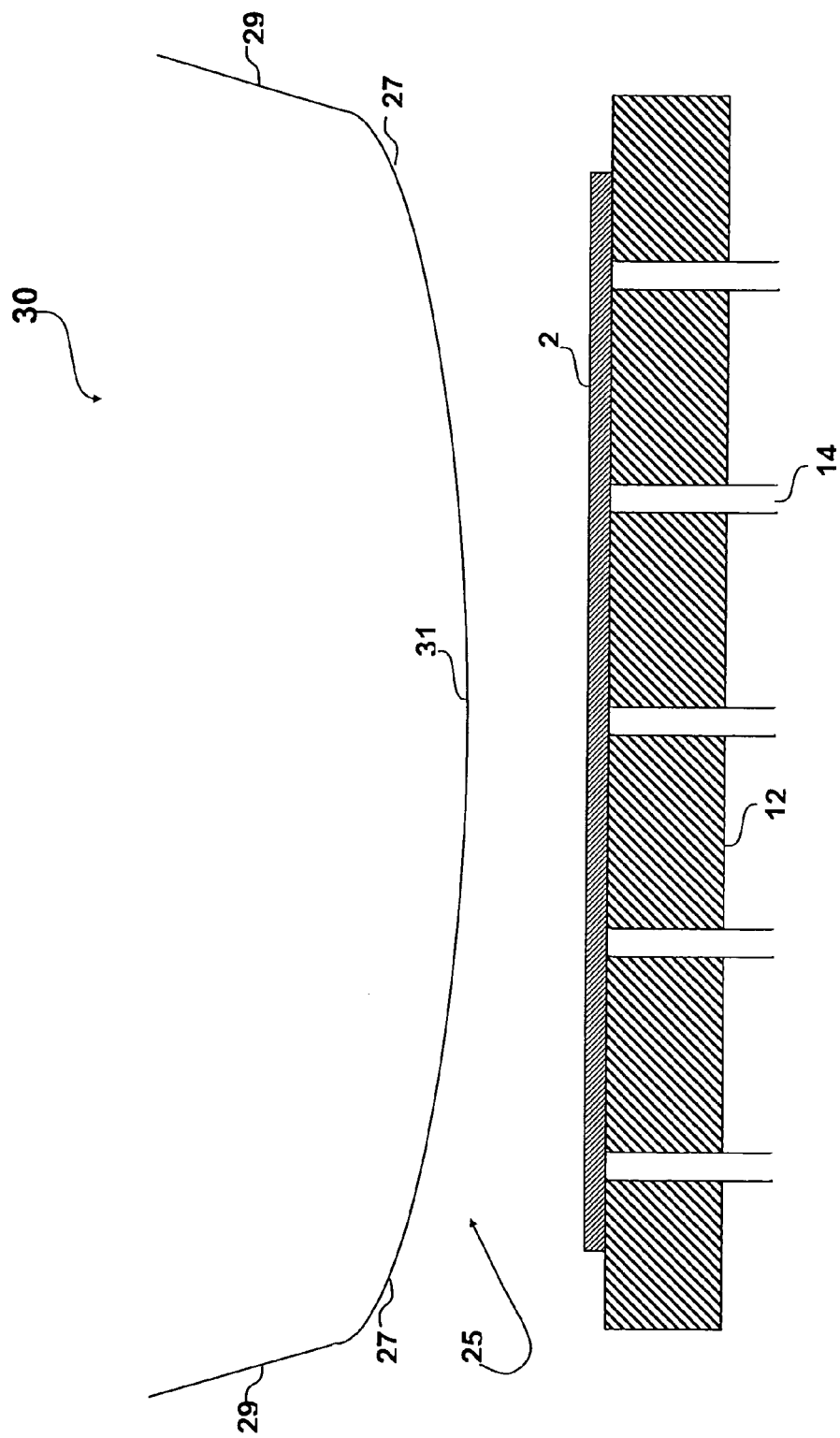
FIG. 2 illustrates a cross-sectional view of a photolithographic apparatus that may be utilized in a photolithographic system in accordance with an alternative embodiment of the present invention.

By way or example and not limitation, the top, side, and/or bottom membranes of the fluid containers depicted in FIG. 1, as well as those illustrated in FIGS. 2 and 3, may be made of an amorphous fluoropolymer, such as TEFLON-AF (a product of E.I. DuPont de Nemours and Company).

With reference to FIGS. 2 and 3, there is illustrated a cross section view of a photolithographic stage apparatus 30 and system that may be utilized in a photolithographic process in accordance with an alternate embodiment of the present invention. As with apparatus 15, photolithographic stage apparatus 30 includes wafer 2 supported by wafer chuck 12. Photolithographic stage apparatus 30 further includes a fluid container 25 having a transparent, pliable bottom membrane 31 for covering the working surface of wafer 2 and which extends well beyond the vertical edges of wafer 2 to form skirt regions 27. In a substantial departure from the embodiment shown in FIG. 1 in which fluid container 5 is enclosed, fluid container 25 comprises an open membrane enclosure wherein bottom membrane 31 provides vertical containment and sidewalls 29 provide horizontal containment and form an open mouth. The open reservoir formed thereby is accessible from above, enabling the apparatus 30 to be more flexibly deployed using various immersion lithography techniques.

Referring now to FIG. 3, a photolithographic system 20 in accordance with an alternate embodiment of the present invention is depicted. Photolithographic system 20 generally comprises photolithographic stage apparatus 30 positioned below lens assembly 4. Photolithographic stage apparatus 30 includes open fluid container 25 forming an open reservoir containing an immersion fluid 3. As with the embodiment illustrated in FIG. 1, fluid 3 preferably comprises a transparent (i.e. low absorption for the lithographic light source wavelength) liquid having an index of refraction greater than that of an air medium. The open reservoir configuration enables the final lens element of lens assembly 4, in this case lens cover 6, to be partially or fully immersed below the surface of immersion fluid 3.

Photolithographic stage apparatus 30, including the open fluid reservoir, is movable as a substantially discrete unit with respect to lens assembly 4 such as during a scanning or step and scan process. In this manner, the embodiment shown in FIG. 3 provides a particularly advantageous immersion lithography arrangement whereby the surfaces of wafer 2 and the other stage equipment are not directly exposed to the immersion fluid, resulting in minimum redesign of stage equipment as well as providing greater flexibility in selecting an immersion fluid having optimal refractive and low absorption properties. Furthermore, eliminating direct contact between immersion fluid 3 and the working surface of wafer 2 reduces the likelihood of obstructing contaminants being introduced into the fluid and also reduces the likelihood of bubble formation that would otherwise occur at the wafer fluid boundary. Moreover, the open reservoir fluid containment enables photolithographic system 20 to be deployed in either a "bathtub" or "shower" method in which the immersion fluid is circulated by leading and trailing nozzles 32 and 34. For example, nozzles 32 and 34 may be deployed in the depicted proximity to lens cover 6 to respectively discharge and uptake a fluid layer on the bottom surface of lens cover 6 such as during a scanning or step and scan process in which apparatus 30 moves with respect to lens assembly 4.

While this invention has been described in terms of several embodiments, it is contemplated that alterations, permutations, and equivalents thereof will become apparent to one of ordinary skill in the art upon reading this specification in view of the drawings supplied herewith. It is therefore intended that the invention and any claims related thereto include all such alterations, permutations, and equivalents that are encompassed by the spirit and scope of this invention.

What is claimed is:

1. A photolithographic apparatus for use in a photolithographic system for projecting light onto a workpiece, said photolithographic apparatus comprising a container containing a transparent fluid, said container having a bottom membrane contacting an upper surface of the workpiece and overlapping at least one side edge of the workpiece such that a fluid filled skirt is formed extending beyond the at least one edge of the workpiece.

2. The photolithographic apparatus of claim 1, wherein the fluid filled skirt is formed at the side edge of the workpiece such that the bottom membrane substantially contacts and conforms to the surface contour of the upper surface and the at least one side edge of the workpiece.

3. The photolithographic apparatus of claim 1, wherein the bottom membrane comprises a flexible, liquid impermeable membrane.

4. The photolithographic apparatus of claim 1, wherein the bottom membrane comprises a transparent material.

5. The photolithographic apparatus of claim 1, wherein the workpiece is a semiconductor wafer.

6. The photolithographic apparatus of claim 5, wherein the upper surface of the semiconductor wafer is coated with a photoresist material.

7. The photolithographic apparatus of claim 1, wherein the bottom membrane provides vertical containment of the optical transmission fluid, said container further including a side wall member coupled to said bottom membrane, said side wall providing horizontal fluid containment.

8. The photolithographic apparatus of claim 7, said side wall member coupling the bottom membrane to a top membrane to form a substantially liquid impermeable container enclosure.

9. The photolithographic apparatus of claim 8, further comprising a final lens element disposed over and in substantial abutment with the top membrane.

10. The photolithographic apparatus of claim 9, wherein said final lens element is a photolithographic lens cover.

11. The photolithographic apparatus of claim 7, wherein said side wall member and bottom membrane form an open fluid container externally accessible from above.

12. The photolithographic apparatus of claim 11, further comprising a lens apparatus disposed over the open fluid container.

13. The photolithographic apparatus of claim 12, wherein said lens apparatus includes a final lens element contacting the fluid within the container.

14. A projection exposure apparatus providing photolithographic processing of a semiconductor workpiece, said projection exposure apparatus comprising a fluid container having a bottom membrane and a side wall member defining an open reservoir containing a transparent fluid, wherein said container is disposed over the semiconductor workpiece such that the bottom membrane lays in contact with at least a portion of the upper surface of the semiconductor workpiece.

15. The projection apparatus of claim 14, wherein the bottom membrane of said container is transparent.

16. The projection apparatus of claim 14, wherein the bottom membrane comprises a flexible material such that the lower outer surface of the open fluid reservoir substantially conforms to the surface contour of the upper surface of the semiconductor workpiece.

17. The projection apparatus of claim 14, wherein the bottom member overlaps at least one side edge of the semiconductor workpiece such that a fluid filled skirt is formed extending beyond the at least one edge of the semiconductor workpiece.

18. The projection apparatus of claim 14, wherein the semiconductor workpiece comprises a semiconductor wafer.

19. A photolithographic system for projecting light onto a workpiece, said photolithographic system comprising:

a fluid container having a transparent bottom membrane and a side wall member defining an open reservoir containing a liquid, wherein said container is disposed over the semiconductor workpiece such that the bottom membrane contacts at least a portion of the upper surface of the semiconductor workpiece; and a lens assembly disposed over the open reservoir such that a final lens element is at least partially immersed within the liquid.

20. The photolithographic system of claim 19, further comprising liquid circulation means for establishing liquid flow on the bottom surface of the final lens element.

* * * * *